(12) United States Patent
Teshirogi et al.

(10) Patent No.: US 8,643,553 B2
(45) Date of Patent: Feb. 4, 2014

(54) RADIATION POWER MEASURING METHOD AND RADIATION POWER MEASURING APPARATUS

(75) Inventors: Tasuku Teshirogi, Atsugi (JP); Shigenori Mattori, Atsugi (JP); Takashi Kawamura, Atsugi (JP); Aya Yamamoto, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 350 days.

(21) Appl. No.: 13/213,384

(22) Filed: Aug. 19, 2011

(65) Prior Publication Data
US 2012/0050118 A1  Mar. 1, 2012

(30) Foreign Application Priority Data
Aug. 31, 2010  (JP) ................................. 2010-193990

(51) Int. Cl.
*G01R 29/10* (2006.01)
(52) U.S. Cl.
USPC .......................................................... 343/703
(58) Field of Classification Search
USPC ........................................... 343/703; 702/76
See application file for complete search history.

(56) References Cited

U.S. PATENT DOCUMENTS

| | | | | |
|---|---|---|---|---|
| 5,432,523 A * | 7/1995 | Simmers et al. | ............... | 343/703 |
| 6,448,787 B1 * | 9/2002 | Oglesby | ......................... | 324/612 |
| 6,850,851 B1 * | 2/2005 | Fourestie et al. | ............... | 702/65 |
| 7,880,670 B2 * | 2/2011 | Villarroel et al. | ............. | 342/165 |

FOREIGN PATENT DOCUMENTS

WO  2009/041513 A1  2/2009

* cited by examiner

*Primary Examiner* — Huedung Mancuso
(74) *Attorney, Agent, or Firm* — Pearne & Gordon LLP

(57) ABSTRACT

Provided is a technique capable of accurately calculating the radiation power of an object to be measured using a spheroidal coupler even when there is a non-negligible loss in a measurement system.
A phase rotating unit including a variable phase shifter, a two-branch circuit, and a reflective element that is connected to one of the branched outputs of the two-branch circuit is inserted between a receiving antenna and a power measuring device. The maximum value and the minimum value of power measured by a power measuring device when the variable phase shifter changes a phase are calculated. An output reflection coefficient of a coupler is calculated from the ratio of the maximum value to the minimum value, and an input reflection coefficient of an object to be measured which is approximate to the output reflection coefficient is estimated. In addition, an input reflection coefficient of a reference antenna which is used instead of the object to be measured is estimated in the same way. The total radiated power of the object to be measured is calculated on the basis of the estimated input reflection coefficients and the reception power when the power measuring device directly measures the output of the receiving antenna.

12 Claims, 14 Drawing Sheets

(a)

(b)

(a)

FREQUENCY: 840MHz
TRANSMITTING AND RECEIVING
  ANTENNAS: SLEEVE ANTENNAS (b)

FREQUENCY: 1.47GHz
TRANSMITTING AND RECEIVING
  ANTENNAS: SLEEVE ANTENNAS

Tx:EUT 1.47GHz
Rx:sleeve antenna (a) MONOPOLE (MATCHING)

Tx:EUT 1.47GHz(VSWR=3)
Rx:sleeve antenna (b) MONOPOLE (VSWR=3)

RADIATION POWER MEASURING METHOD AND RADIATION POWER MEASURING APPARATUS

BACKGROUND OF THE INVENTION

1. Field of the Invention

The present invention relates to a technique for measuring the radiation power of a small wireless terminal and more particularly, to a technique for simplifying the internal mechanism of a coupler to prevent an increase in the size of an apparatus, achieving accurate coupling, and accurately measuring the total radiated power of the wireless terminal even when there is a loss in a system, in a method and apparatus that measures the total radiated power of the wireless terminal using the coupler which includes a space that forms a spheriod and is surrounded by a metal wall surface and in which radio waves emitted from the wireless terminal that is arranged at one focal position are concentrated on a receiving antenna that is arranged at the other focal position.

2. Description of Related Art

With the advent of a ubiquitous society, the explosive growth of subminiature wireless terminals, such as wireless apparatuses related to RFID (wireless tag), UWB (Ultra Wide Band), and BAN (Body Area Network), is expected.

In general, these wireless apparatuses do not have a test terminal due to restrictions in dimensions or for economic reasons, like the wireless apparatus according to the related art. Therefore, it is necessary to receive radio waves emitted from the apparatus in order to test the apparatus.

In particular, the radiation power of the small wireless terminal is strictly regulated considering, for example, an influence on other communication and an influence on the human body, and the measurement of radiation power is an important test item.

Examples of the radiation power include EIRP (equivalent isotropically radiated power) in an arbitrary direction and total radiated power (TRP) emitted to the entire space. The structure of an apparatus for measuring EIRP is complicated and it takes a longtime to measure EIRP. Therefore, TRP is generally treated.

The following TRP measuring methods have been known.

(1) A spherical scanning method that scans a spherical surface including a device under test with a probe, measures radiation power at a mesh point, and adds the measured radiation power.

(2) A method that rotates and mix radio waves emitted from a device under test with a metal blade to generate a random field in a metal covered chamber and estimates the total radiated power of the device under test on the basis of a statistical method.

(3) A method using a pyramid-shaped space covered with a metal film and a device called a G-TEM cell which generates TEM waves in a radio wave absorber.

(4) An electromagnetic wave coupling device that includes a plurality of antennas, isolators connected to the antennas, a phase regulator, and a synthesizer which synthesizes the signals of the array antennas and measures the radiation power of an object to be measured which is disposed on the center line of the array.

The spherical scanning method can measure radiation power with high accuracy, but has problems in that it requires large equipment (for example, a radio anechoic chamber and a spherical scanner) and it takes a long time to measure radiation power.

In addition, the spherical scanning method receives the radio waves emitted to a very small portion of the entire space, calculates radiation power, and adds the radiation power. Therefore, reception sensitivity at each measurement point is very low and it is difficult to measure low level spurious signals.

The method that agitates radio waves in the metal covered chamber does not require a large radio anechoic chamber, but has problems in that there is ambiguity in the consistency between the random field that is artificially generated and a theoretical stochastic model, there is large uncertainty since the method is based on a statistical process, and it takes a long time to measure the radiation power. In addition, it is difficult to measure low level spurious signals, similarly to the spherical scanning method.

In the G-TEM cell, it is difficult to ensure the uniformity of an internal electric field distribution and a biaxial rotating table needs to be provided in the G-TEM cell such that the direction of an object to be measured is changed to all directions, in order to measure the total radiated power.

As a technique for solving the above-mentioned problems, the inventors proposed a method of measuring the total radiated power of wireless terminal using a coupler having a spheroidal closed space (International Publication No. WO/2009/041513).

In the measuring method, an object to be measured and a receiving antenna are arranged at the focal positions of the closed space which forms a spheroid obtained by rotating an ellipse about an axis linking the focuses and is surrounded by a metal wall surface, radio waves emitted from the object to be measured are reflected from the wall surface and are then concentrated on the receiving antenna, and the total radiated power of the object to be measured is measured.

SUMMARY OF THE INVENTION

When the coupler having the spheroidal space is used, it is ideal that the degree of coupling between the object to be measured and the receiving antenna is 1. However, in practice, the radio waves emitted from the object to be measured are concentrated in the vicinity of the focus with different phases due to, for example, the size of the object to be measured or the influence of side lobes. As a result, the radio waves destructively interfere with each other and are then cancelled, which makes it difficult to accurately measure the total radiated power.

In order to solve the difficulty, the following technique is considered: the positions of a transmission reference antenna which is used instead of the object to be measured and a receiving antenna are continuously moved such that the distance therebetween is changed along a line linking the focuses in the range near the focuses; a position where the reflection coefficient of the transmission reference antenna is the minimum and a transmission coefficient from the reference antenna to the receiving antenna is the maximum is found; the object to be measured is arranged instead of the transmission reference antenna at the position as a complete coupling position; the receiving antenna receives the radio waves emitted from the object to be measured; and the radiation power of the object to be measured is calculated from the ratio of the reception level at that time and the level of a received signal when the transmission reference antenna is used and power supplied to the transmission reference antenna.

However, when the technique is used, it is necessary to provide two sets of mechanisms for continuously moving the reference antenna and the receiving antenna in the coupler.

Even when the amount of movement is the minimum, a ±1 wavelength of the radio wave to be measured is needed. When the frequency is low, the moving range increases. In this case, the size of the coupler increases with the increase in the moving range, which results in an increase in the size of the apparatus and costs. Only a driving unit of the moving mechanism may be arranged outside the coupler. However, in this case, the overall size of the apparatus increases.

In order to find a complete coupling position in a space, it is necessary to provide a three-dimensional displacement mechanism including the direction of the axis linking two focuses as well as the one-dimensional displacement mechanism along the axis linking the two focuses. However, when two sets of the complicated three-dimensional displacement mechanisms are provided, the size of the apparatus further increases and costs further increase.

As a means for solving the above-mentioned problems, the inventors found a technique in which a matching box was inserted between a coupler and a power measuring device and made reception power maximum, thereby obtaining a very high degree of coupling.

However, complete coupling is ensured only when there is no loss in the system. When there is a non-negligible loss in the system, complete coupling is not obtained and the accuracy of measurement is reduced.

The invention has been made in view of the above-mentioned problems and an object of the invention is to provide a radiation power measuring method and apparatus that can obtain an ideal coupling state between transmission and reception, thereby constructing a small system at a low cost, without providing a continuous moving mechanism in a coupler, and can accurately perform measurement even when there is a non-negligible loss in the system.

In order to achieve the object, according to an aspect of the invention, there is provided a radiation power measuring method of measuring the total radiated power of an object to be measured using a structure in which radio waves are emitted from the object (1) which is disposed in the vicinity of one focus (F1) in a closed space (12) that forms a spheroid obtained by rotating an ellipse about an axis passing through two focuses (F1, F2) and is surrounded by a metal wall surface (11) and are reflected from the wall surface to be concentrated on a receiving antenna (15) which is disposed in the vicinity of the other focus (F2) and a power measuring device (150) measures the power of an output signal from the receiving antenna. The radiation power measuring method includes: a step of connecting the receiving antenna and the power measuring device through a variable phase shifter (131) that changes the phase of the output signal from the receiving antenna and a two-branch circuit (132) that branches an input signal into two signals, one of which is connected to a reflective element (133), and calculating a maximum value and a minimum value of power measured by the power measuring device when the variable phase shifter changes the phase; a step of calculating an output reflection coefficient of the inside of the spheroid from the ratio of the calculated maximum value to the calculated minimum value and estimating an input reflection coefficient of the object which is approximate to the output reflection coefficient; a step of estimating an input reflection coefficient of a reference antenna which is used instead of the object; and a step of calculating the total radiated power of the object, on the basis of the estimated input reflection coefficients of the object and the reference antenna and reception power when the power measuring device directly measures the output of the receiving antenna.

According to another aspect of the invention, there is provided a radiation power measuring apparatus including: a coupler (21) that has a closed space which forms a spheroid obtained by rotating an ellipse about an axis passing through two focuses (F1, F2) and is surrounded by a metal wall surface, includes supporting units (50, 55) which support an object (1) to be measured in the vicinity of one focus and support a receiving antenna (15) in the vicinity of the other focus, concentrates radio waves emitted from the object on the receiving antenna, and outputs a signal received by the receiving antenna from the closed space to the outside; a power measuring device (150) that measures the power of the output signal from the receiving antenna; a phase rotating unit (130) that includes a variable phase shifter (131) which changes the phase of an input signal, a two-branch circuit (132) which branches an input signal into two signals, and a reflective element (133) which reflects one of the two branched outputs from the two-branch circuit, is inserted between the receiving antenna and the power measuring device, and changes the phase of the input signal using the variable phase shifter to change the phase of the output signal from the receiving antenna, thereby changing a measured value of the power measuring device; an object input reflection coefficient estimating unit (191) that calculates the ratio of a maximum value to a minimum value of the measured value of the power measuring device which is changed by the phase rotating unit, calculates an output reflection coefficient of the coupler for the object from the ratio, and estimates an input reflection coefficient of the object which is approximate to the output reflection coefficient; a reference antenna input reflection coefficient estimating unit (192) that calculates the output reflection coefficient of the coupler when a reference antenna is used instead of the object and estimates an input reflection coefficient of the reference antenna which is approximate to the output reflection coefficient; and a total radiated power calculating unit (193) that calculates the total radiated power of the object, on the basis of the estimated input reflection coefficients of the object and the reference antenna and reception power when the power measuring device directly measures the output of the receiving antenna.

As described above, in the radiation power measuring method and apparatus according to the invention, the variable phase shifter and the two-branch circuit including the reflective element are inserted between the receiving antenna and the power measuring device. The input reflection coefficient of the object to be measured is estimated from the ratio of the maximum value to the minimum value of reception power obtained by the rotation of the phase by the variable phase shifter. In addition, the input reflection coefficient of the reference antenna which is used instead of the object to be measured is estimated. The total radiated power of the object to be measured is calculated on the basis of the two input reflection coefficients and the reception power when the output of the receiving antenna is directly measured.

This measurement principle is based on the following findings: the phase rotating unit connected to the coupler rotates the phase to generate a ripple in reception power; the output reflection coefficient of the coupler can be calculated from the ratio of the maximum value to the minimum value of the reception power; and the output reflection coefficient is approximate to the input reflection coefficient by the coupler with a small loss. Even when there is a non-negligible loss in the measurement system, it is possible to accurately calculate the radiation power of an object to be measured using the obtained input reflection coefficient and the reception power which is directly measured without using a phase rotating unit, without being affected by the loss.

In addition, it is not necessary to continuously change the position of the object to be measured or the receiving antenna in order to adjust coupling. Therefore, it is possible to construct a small system at a low cost.

DETAILED DESCRIPTION OF THE INVENTION

Measuring Method

Hereinafter, exemplary embodiments of the invention will be described with reference to the accompanying drawings.

Figure 1:
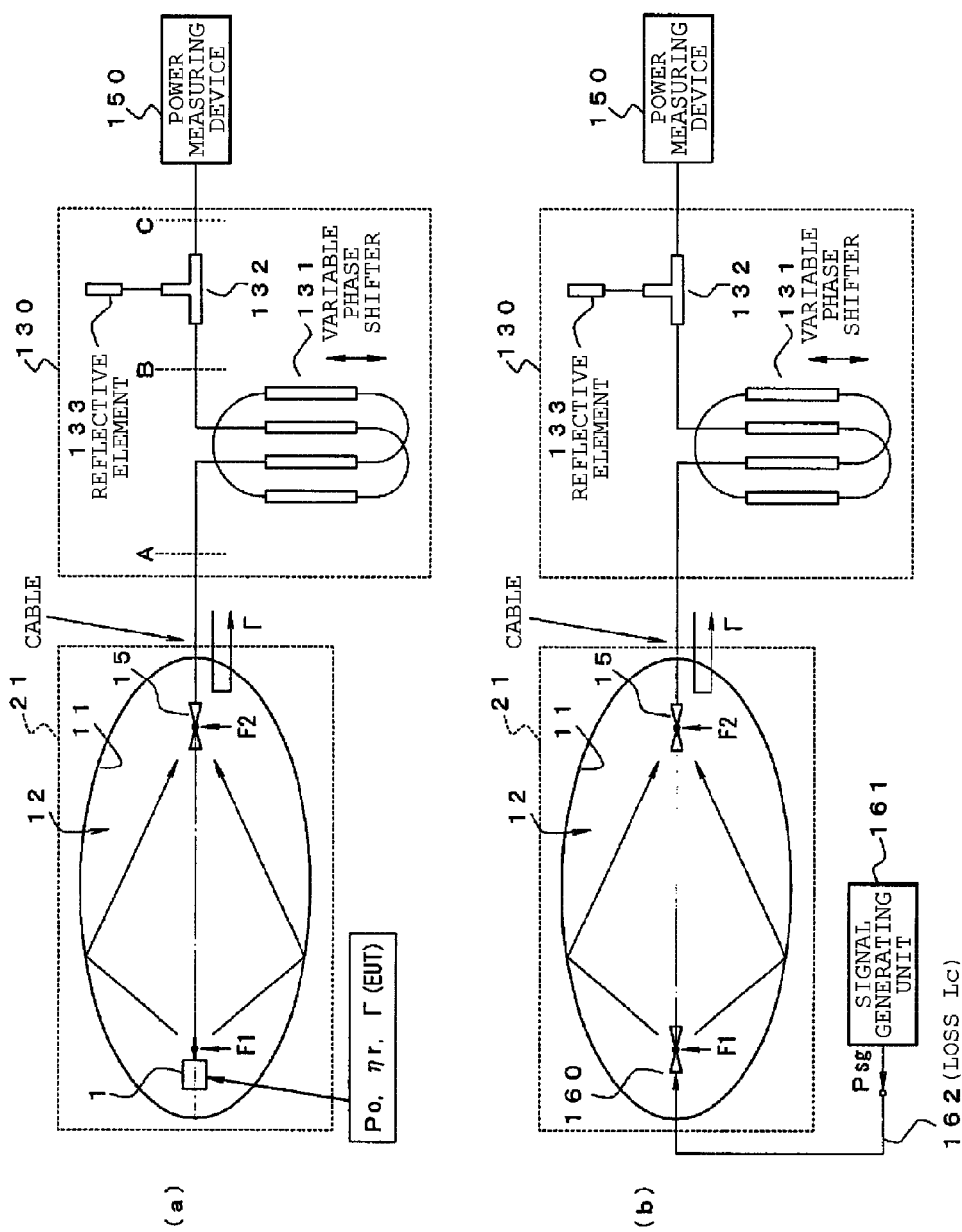
FIGS. 1A and 1B are system diagrams illustrating a measuring method according to the invention.

FIGS. 1A and 1B are diagrams illustrating the principle of a measuring method according to the invention.

FIG. 1A shows the structure of a measurement system when an object 1 to be measured is set and measured. In FIG. 1A, in a coupler 21 including a closed space 12 that forms a spheroid obtained by rotating an ellipse about a long axis thereof and is surrounded by a metal wall surface 11, the center of emission of radio waves of the object 1 to be measured is substantially aligned with the position of one focus F1 on the long axis and the radio waves emitted from the object 1 to be measured are reflected from the wall surface 11 and are concentrated on a receiving antenna 15 that is arranged at the position of the other focus F2.

A signal is output from the receiving antenna 15 to the outside of the coupler 21 and is then input to a phase rotating unit 130. The phase rotating unit 130 includes a variable phase shifter 131, a two-branch circuit 132, and a reflective element 133.

The variable phase shifter 131 includes, for example, a trombone-type variable-length transmission path (in this embodiment, a structure that drives four variable-length lines at the same time is shown). The length of the transmission path is changed manually or by the control of a measurement control unit 190, thereby continuously changing the phase of an output signal with respect to an input signal.

The output of the variable phase shifter 131 is branched into two paths by the two-branch circuit 132. One of the two paths is connected to a power measuring device 150 and the other path is connected to the reflective element 133. The reflective element 133 reflects a branched signal with a fixed reflection coefficient Γr. For example, a receiver or a spectrum analyzer may be used as the power measuring device 150.

Next, the phase rotating unit 13 will be described.

Figure 2:
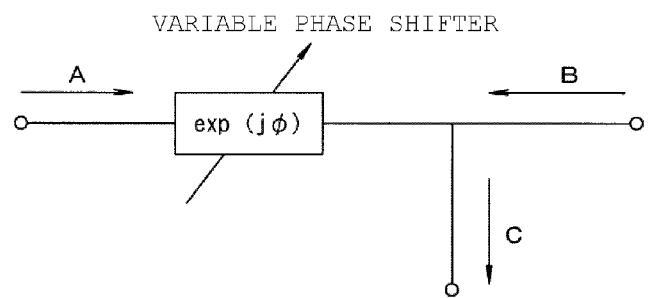
FIG. 2 is a diagram schematically illustrating a phase rotating unit 130.
Figure 3:
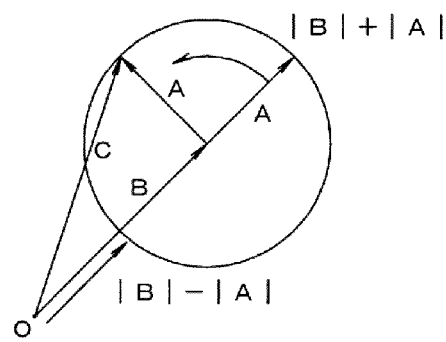
FIG. 3 is a vector diagram illustrating the phase rotating unit 130.
Figure 4:
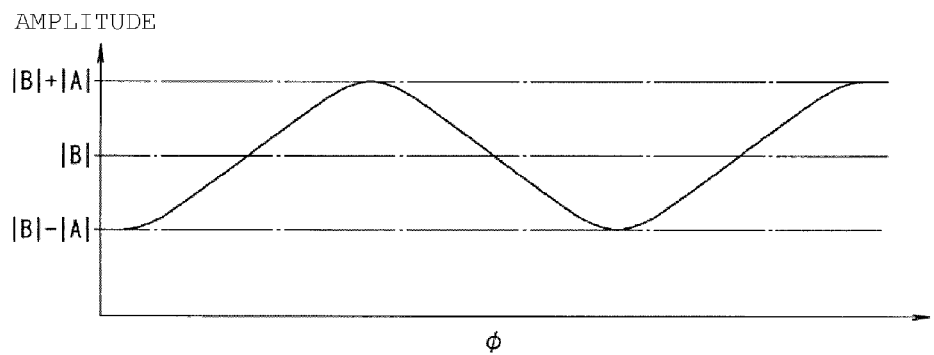
FIG. 4 is a diagram illustrating a change in amplitude caused by the rotation of a phase.

When the phase rotating unit 13 is regarded as a three-port circuit shown in FIG. 2, in the electric field on the phase plane of the signal of each port, a vector A rotates about the leading end of a vector B having the base O, as shown in FIG. 3. A vector C is a resultant wave of the known fixed vector B and the unknown vector A, is from the base O to the leading end of the vector A, and has an amplitude |C|. As shown in FIG. 4, the vector C is periodically changed (rippled) with the phase rotation of the vector A and has a maximum value of |B|+|A| and a minimum value of |B|−|A|.

When the ratio of the maximum value to the minimum value is ρ, ρ is represented by the following Expression 1:

$$\rho = (|B| - |A|)/(|B| + |A|).$$ [Expression 1]

The unknown amplitude |A| is calculated by the following Expression 2:

$$|A| = |B| \cdot (1-\rho)/(1+\rho).$$ [Expression 2]

That is, the unknown amplitude |A| can be calculated by the known amplitude |B| and the ratio ρ of the maximum value to the minimum value when the phase is rotated. The order of the variable phase shifter 131 and the two-branch circuit 132 may be reversed.

The use of the above-mentioned technique makes it possible to measure the radiation power of the object to be measured even when there is a non-negligible loss in the coupler 21.

This will be described below.

In the measurement system shown in FIG. 1A, the transmission output of the object 1 to be measured is Po, the radiation efficiency of the antenna is ηr, an input reflection coefficient is Γ(EUT), the transmission coefficient of a connection cable and the variable phase shifter 131 is K, the amount of phase shift is exp(−jθ), and the reflection coefficient of the reflective element 133 as viewed from an input end B is Γr.

In addition, the scattering matrix [S] of the entire measurement system is calculated by analyzing the scattering matrix [Sc] of the coupler 21, the scattering matrix [Sp] of the connection cable and the variable phase shifter 131, and the scattering matrix [Sr] of the reflective element 133 as a cascaded circuit.

The scattering matrices [Sc], [Sp], and [Sr] may be represented by the following Expressions 3 to 5:

$$[S_C] = \begin{bmatrix} S_{C11} & S_{C12} \\ S_{C21} & S_{C22} \end{bmatrix} = \begin{bmatrix} \Gamma(EUT) & S_{C12} \\ S_{C21} & \Gamma \end{bmatrix};$$ [Expression 3]

$$[S_P] = \begin{bmatrix} 0 & Ke^{-j\phi} \\ Ke^{-j\phi} & 0 \end{bmatrix}; \text{and}$$ [Expression 4]

$$[S_r] = \begin{bmatrix} S_{r11} & S_{r12} \\ S_{r21} & S_{r22} \end{bmatrix} = \begin{bmatrix} \Gamma_r & S_{r12} \\ S_{21} & S_{r22} \end{bmatrix}.$$ [Expression 5]

From the scattering matrices, the transmission coefficient $S_{21}$ of the entire system [S] from the antenna input terminal of the object 1 to be measured to the output end (the output end of the power measuring device 150) is represented by the following Expression 6:

$$|S_{21}|^2 = \frac{K^2|S_{C21}|^2|S_{r21}|^2}{|1 - K^2 e^{-j2\phi}\Gamma\Gamma_r|^2}.$$ [Expression 6]

The line length of the variable phase shifter is changed to rotate the phase of a reflected wave, thereby calculating the ratio (power ratio) $\rho^2$ of the maximum value to the minimum value of the measured power. When the line length where power is the maximum is La, the line length where power is the minimum is Lb, and a transmission coefficient K is K(La) and K(Lb) in the functions thereof, the ratio $\rho^2$ is represented by the following Expression 7:

$$\rho^2 = \left| \frac{1 - K^2(Lb)|\Gamma||\Gamma r|}{1 + K^2(La)|\Gamma||\Gamma r|} \right|^2.$$ [Expression 7]

When Expression 7 is solved for the output reflection coefficient $\Gamma$ of the coupler 21, the following Expression 8 is obtained:

$$|\Gamma| = \frac{1 - \rho}{|\Gamma r|[K^2(Lb) + \rho K^2(La)]}.$$ [Expression 8]

As can be seen from Expression 8, when the reflection coefficient $\Gamma r$ of the reflective element 133, the transmission coefficient K, and the ratio $\rho$ are known, it is possible to determine the output reflection coefficient $\Gamma$ of the coupler 21.

The coupler 21 has large Q and a sufficiently small loss due to its structure. Therefore, the input reflection coefficient of the coupler 21 is substantially equal to the output reflection coefficient thereof. That is, $\Gamma(EUT)=\Gamma$ is established. Therefore, it is possible to accurately estimate the input reflection coefficient of the object 1 to be measured by calculating the output reflection coefficient of the coupler 21.

When the spheroidal coupler 21 is used to measure radiation power, the position of the object 1 to be measured and the position of the receiving antenna 15 are changed to find a position where coupling efficiency is high and power is measured at the position. However, in this case, complete matching is not ensured. Therefore, when mismatching can be compensated for, it is possible to measure total radiated power with high accuracy.

However, in practice, there is a reflecting surface loss and a receiving antenna loss in the coupler 21 and the influence of the loss is not negligible. In order to remove the influence, it is necessary to perform correction using a reference antenna system instead of the object 1 to be measured.

That is, the measurement process performed on the object to be measured is performed on a reference antenna 160 in the system shown in FIG. 1B to estimate the input reflection coefficient $\Gamma(REF)$ of the reference antenna 160.

Figure 5:
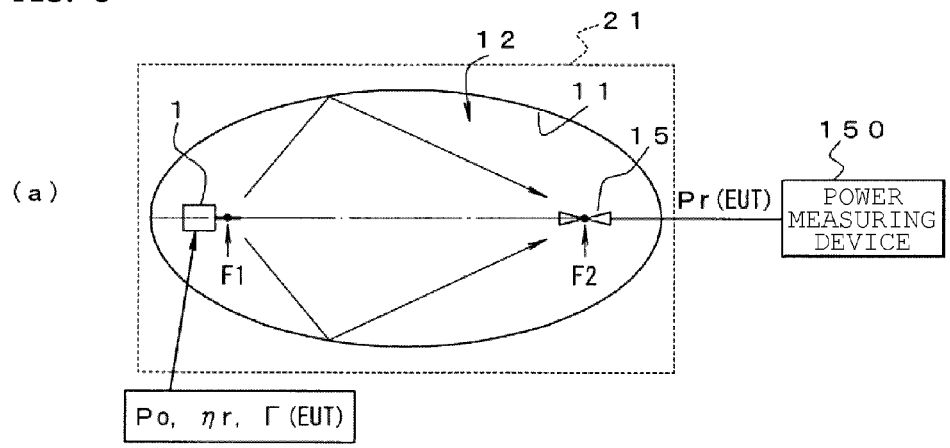
FIGS. 5A and 5B are diagrams illustrating a system for directly measuring reception power.
Figure 5:
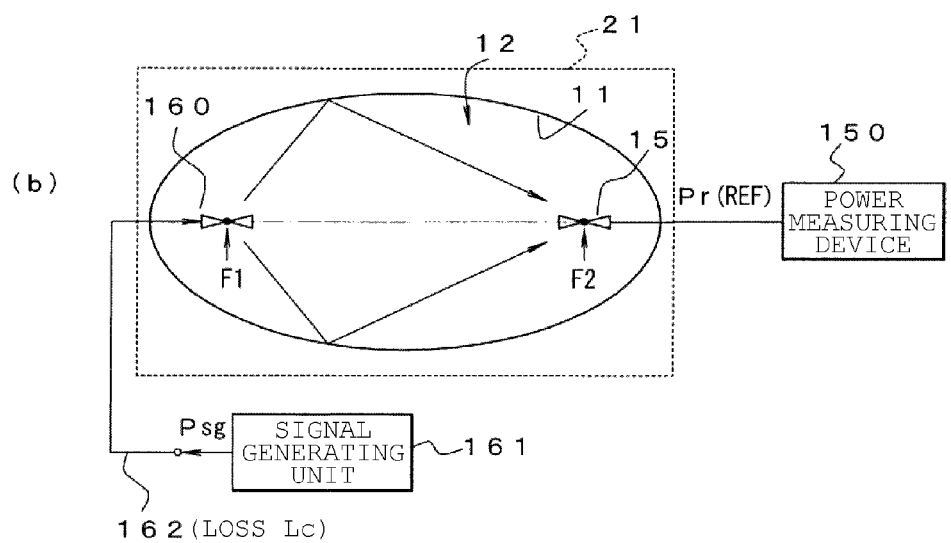

As shown in FIGS. 5A and 5B, reception power is measured with the coupler 21 being directly connected to the power measuring device 150.

In the reference antenna system shown in FIG. 1B and FIG. 5B, when power supplied from a signal generator 161 to the reference antenna 160 through a cable 162 is Psg, the radiation efficiency of the reference antenna 160 is $\eta r'$, and losses common to the two systems, such as a coupler loss, a receiving antenna loss, and a cable loss, are D, the reception power Pr(EUT) of the system using the object 1 to be measured and the reception power Pr(REF) of the system using the reference antenna are respectively represented by the following Expressions 9 and 10:

$$Pr(EUT)=Po\eta r(1-|\Gamma(EUT)|^2)D; \text{ and}$$ [Expression 9]

$$Pr(REF)=Psg\eta r'(1-|\Gamma(REF)|^2)D.$$ [Expression 10]

When the common loss D is removed by the division of Expressions 9 and 10 and the total radiated power $Po\eta r$ of the object 1 to be measured is calculated, the following Expression 11 is obtained:

$$Po\eta r = \frac{Psg\eta r'(1-|\Gamma(REF)|^2)Pr(EUT)}{(1-|\Gamma(EUT)|^2)Pr(REF)}.$$ [Expression 11]

In Expression 11, each value on the right side is known by the above-mentioned measurement. Therefore, it is possible to accurately calculate the total radiated power of the object to be measured in the system with a loss.

The measurement operation of the correction system using the reference antenna 160 does not need to be performed every time. For example, the measurement result obtained by one measurement operation may be stored in a memory and the above-mentioned calculation may be performed on the basis of the measurement result stored in the memory and the measurement result of the measurement system.

In the above-described embodiment, the frequency is fixed. However, the transmittance of the coupler 21 is likely to be significantly reduced (dipped) according to the relationship between the measurement frequency and the shape of the coupler (the eccentricity of the ellipse and the distance between the focuses).

Therefore, when measurement is performed at a fixed frequency, the output of the receiving antenna is directly input to the power measuring device 150 without passing through the phase rotating unit 130, and the distance between the object 1 to be measured or the reference antenna 160 and the receiving antenna 15 (hereinafter, referred to as an inter-antenna distance) is adjusted such that the reception power is the maximum. Thereafter, the measurement is performed.

According to this method, the reflection coefficient $\Gamma r$ of the reflective element 133 may be known (however, when there is no reflection, no ripple occurs, which makes it difficult to perform measurement), and the output reflection coefficient $\Gamma$ of the coupler 21 can be calculated regardless of the value of the reflection coefficient. In order to verify the above, an experiment was conducted to examine whether the output reflection coefficient $\Gamma$ of the coupler 21 was not changed when a different reflection coefficient $\Gamma r$ is given to the reflective element 133.

Figure 6:
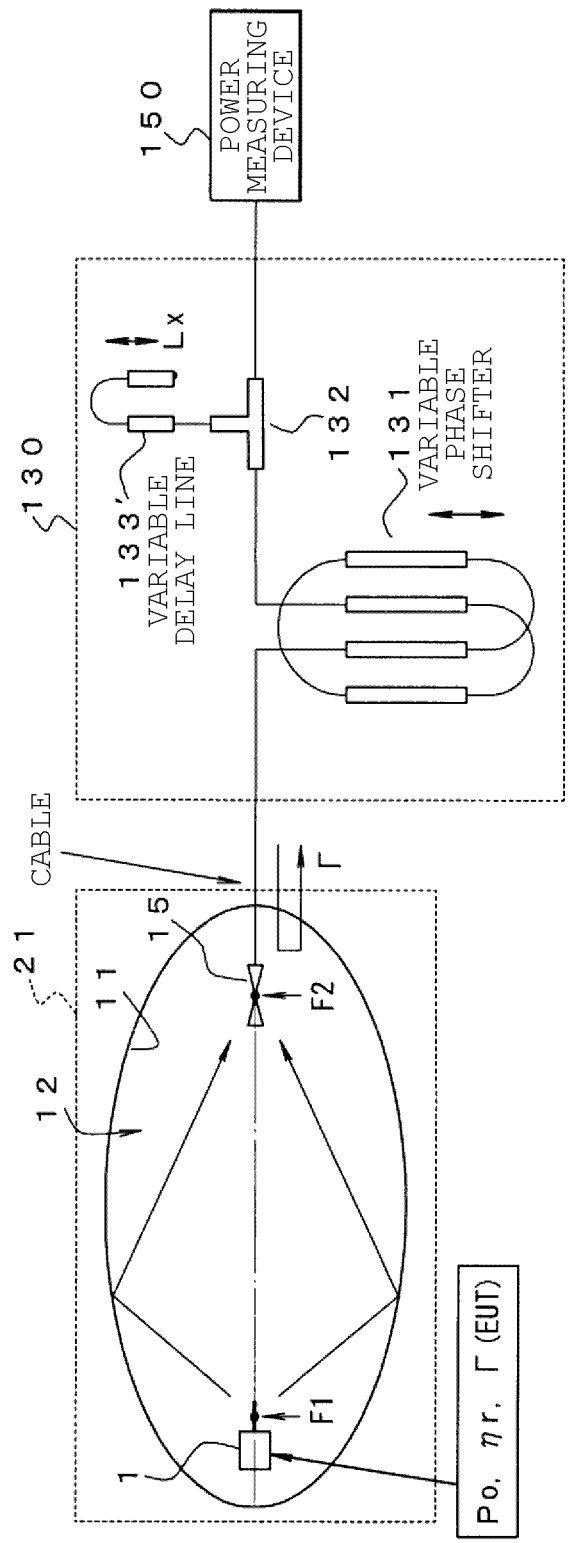
FIG. 6 is a diagram illustrating a system for changing a reflection coefficient of a reflective element.

As shown in FIG. 6, the test system used a variable delay line 133' with a short-circuited leading end instead of the fixed reflective element 133 and the length Lx of the variable delay line 133' was changed to change the reflection coefficient Γr.

The transmitting antenna (the antenna of the pseudo terminal) and the receiving antenna are sleeve antennas and are (collinearly) arranged substantially at the focal positions on the rotation axis (long axis) of the ellipse of the coupler 21 such that the antennas are directly coupled to each other in the length direction thereof. The transmitting and receiving antennas are moved symmetrically with respect to the center of the rotation axis. When the distance between the antennas is changed, the output reflection coefficient Γ is also changed. In addition, the length (2a) of the coupler 21 in the long axis direction is 1200 mm, the length (2b) thereof in the short axis direction is 1094 mm, and the eccentricity e of the ellipse is 0.41.

Figure 7:
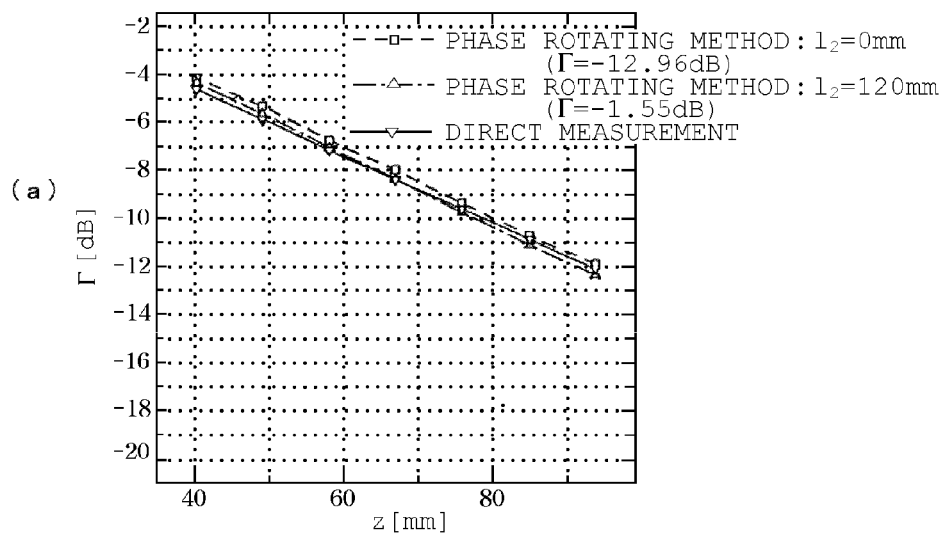
FIGS. 7A and 7B are diagrams illustrating a change in the output reflection coefficient of a coupler due to a change in the reflection coefficient of the reflective element.
Figure 7:
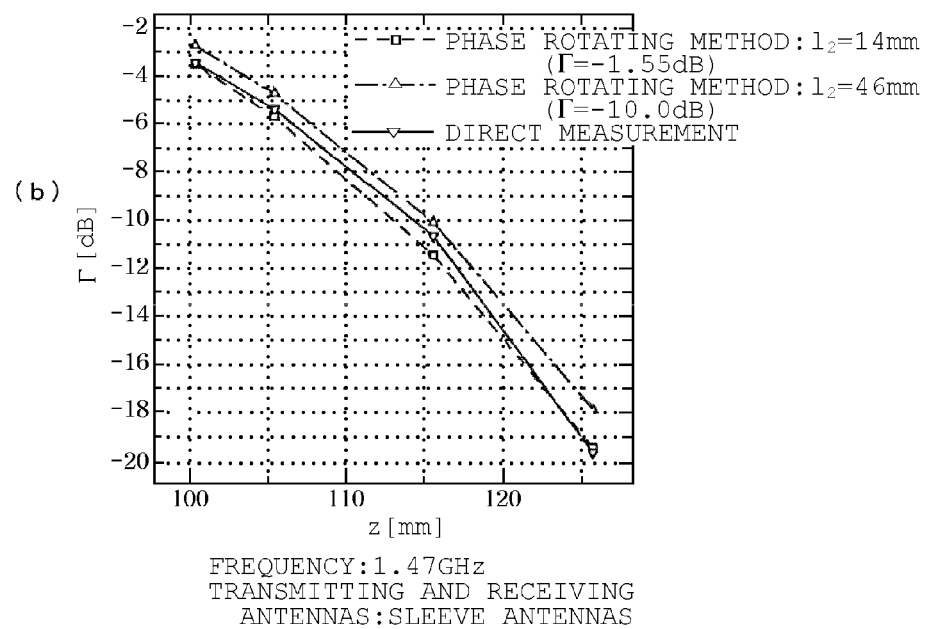

FIG. 7A shows the measurement result when the frequency is 840 MHz and FIG. 7B shows the measurement result when the frequency is 1.47 GHz. In FIGS. 7A and 7B, the horizontal axis z indicates the distance of the transmitting and receiving antennas which are symmetrically moved from the reference positions and the direction in which the distance therebetween increases is the positive direction.

Figure 8:
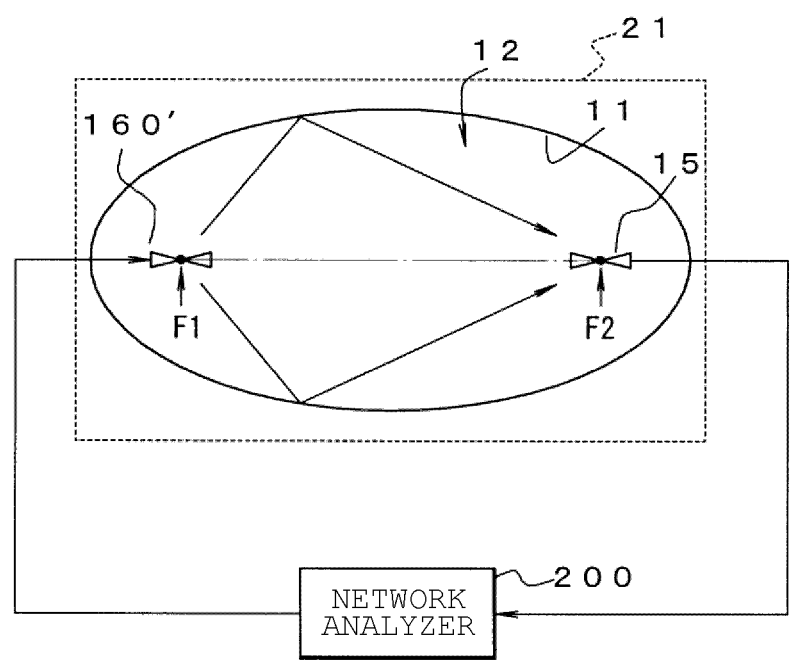
FIG. 8 is a diagram illustrating a system for measuring input and output reflection coefficients when a pseudo terminal is used.

In these graphs, there is little difference between the output reflection coefficients Γ of the coupler 21 when the length of the variable delay line 133' is changed. In addition, as shown in FIG. 8, the phase rotating unit 130 is omitted and a network analyzer 200 is used to directly measure the output reflection coefficient. In this case, the output reflection coefficient is well matched with that measured by the network analyzer.

In addition, an experiment was conducted to examine whether the input reflection coefficient and the output reflection coefficient of the coupler 21 were equal to each other. In the experiment, a transmitter in which a monopole antenna was attached to a metal housing was provided as the pseudo terminal and a sleeve antenna was used as the receiving antenna. In addition, the transmitter and the receiving antenna were collinearly arranged on the long axis of the ellipse, similarly to the above. As a monopole antenna of the transmitter, an antenna that was matched with a signal source or a cable and had a VSWR of about 3 was used. Then, as shown in FIG. 8, the network analyzer 200 measured the input and output reflection coefficients while symmetrically changing the inter-antenna distance, similarly to the above.

Figure 9:
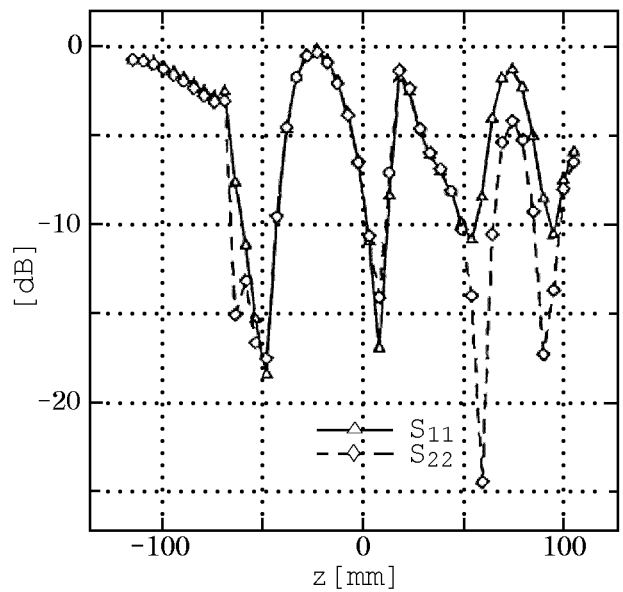
FIGS. 9A and 9B are diagrams illustrating the measurement result of the input and output reflection coefficients when the pseudo terminal is used.
Figure 9:
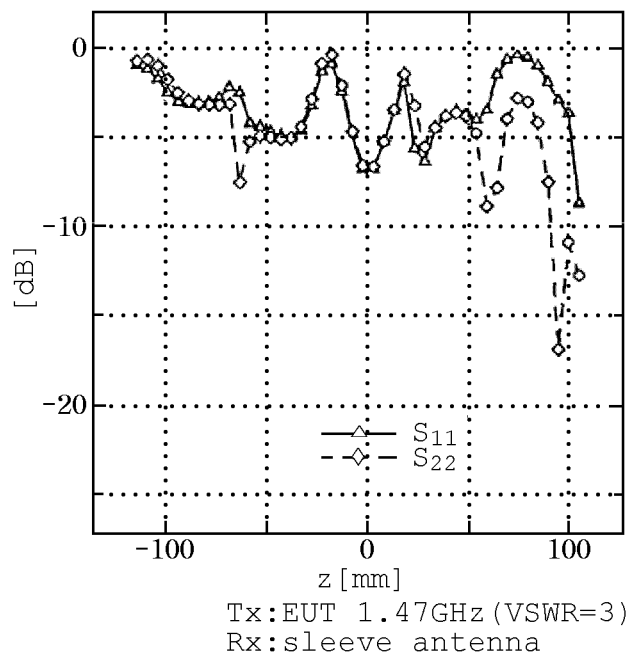

FIG. 9A shows the measurement result when a matched monopole antenna is used and FIG. 9B shows the measurement result when a mismatched (VSWR=3) monopole antenna is used.

As can be seen from the measurement results, the input and output reflection coefficients are substantially equal to each other in the range of |z|<50 mm except for a region in which the transmitting and receiving antennas approach the inner wall of the coupler 21 or a region in which the antennas approach each other, regardless of the matched state of the antenna of the transmitter, and a sufficiently high accuracy of estimation by the above-mentioned measurement principle is ensured.

Next, the actual measurement result of total radiated power will be described.

Figure 10:
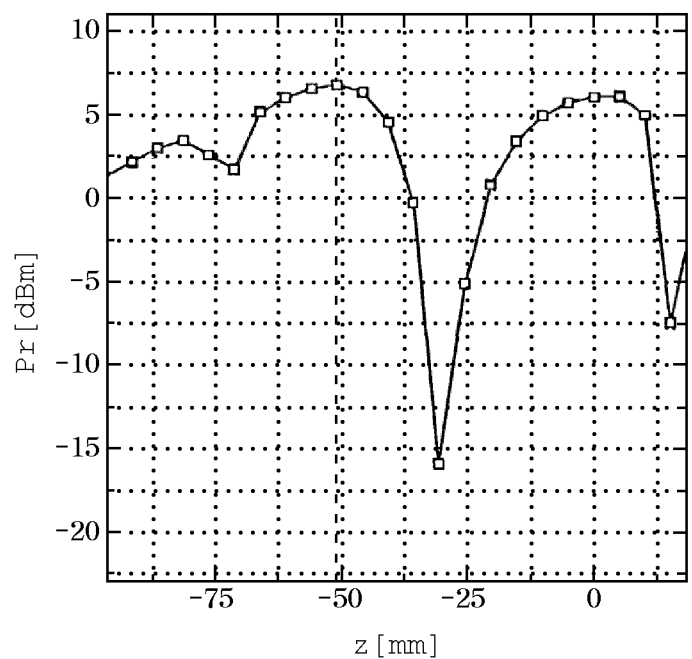
FIG. 10 is a diagram illustrating the measurement result when the reception power of the pseudo terminal is measured while an inter-antenna distance is changed.

In the coupler with the same dimensions as described above, a pseudo terminal that has a transmission output of 10.08 dBm at a frequency of 1.47 GHz is provided as a transmitter and a sleeve antenna is used as a receiver antenna, similarly to the above. Then, reception power is directly measured while the distance between the transmitting and receiving antennas is symmetrically changed, similarly to the above. FIG. 10 is a graph illustrating the measurement result. In this case, since reception power Pr is the maximum at an antenna position z=50 mm, this position is the optimal position.

Figure 11:
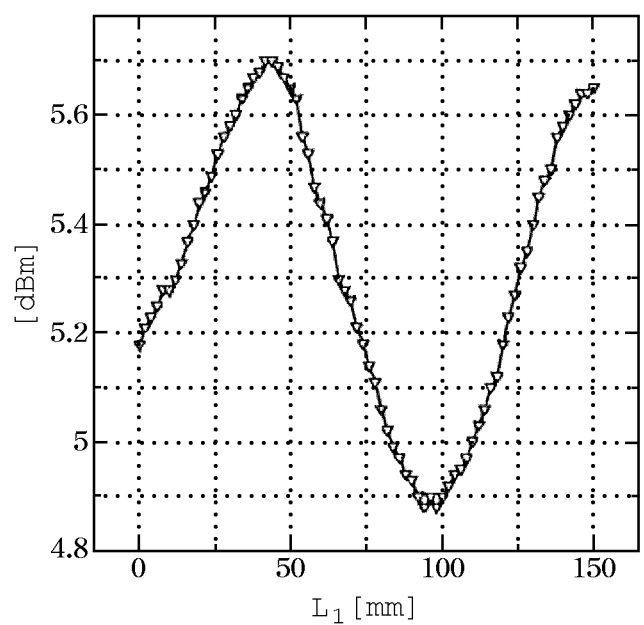
FIG. 11 is a diagram illustrating a change in reception power when the phase of a received signal of the pseudo terminal is rotated.

The phase rotating unit 130 is inserted at the optimal position and rotates the phase to obtain ripple characteristics shown in FIG. 11. In this case, the reflection coefficient of the reflective element 133 is set to −1.71 dB.

When the output reflection coefficient Γ of the coupler 21 is calculated by the above-mentioned measuring method using, for example, the ratio of the maximum value to the minimum value of the reception power, the output reflection coefficient Γ is −14.97 dB. This value is very small and sufficient matching is obtained at the optimal position. However, it is difficult to clearly know the degree of matching using only the method of calculating radiation power at the optimal position, and there is a problem in the accuracy of the measurement result. However, as described above, when the phase is rotated and the output reflection coefficient is estimated, it is possible to solve the problem and strictly calculate total radiated power.

The total radiated power (TRP) calculated using the output reflection coefficient Γ and parameters shown in the following table is 9.90 dBm and the difference (0.2 dB) between the total radiated power and an actual transmission output (antenna power) of 10.08 dBm is sufficiently appropriate, considering the loss (radiation efficiency) of the transmitting antenna. The result of increasing the degree of accuracy of the measuring method is obtained (the following table also includes the calculation result).

TABLE 1

| | |
|---|---|
| Frequency | 1.47 GHz |
| Transmission: Pseudo wireless apparatus | Antenna power $P_0$ = 10.08 dBm |
| | Radiation efficiency $\eta_r$ = −0.21 dB |
| Reception: Sleeve antenna | |
| Fixed reflector | Reflection coefficient Γr = −1.71 dB |
| Loss of measurement system | 2.97 dB |
| Maximum reception power by displacement method | $P_R$ (EUT) = 6.79 dBm |
| Loss of compensation power | 9.76 dBm |
| Estimated reflection coefficient | Γ = −14.97 dB |
| TRP | 9.90 dBm |

As such, according to the measuring method of the invention, it is possible to simply and reliably calculate the total radiated power of the object to be measured. In addition, when the optimal position is found, it is not necessary to continuously move the object 1 to be measured, the reference antenna 160, and the receiving antenna 15 and a moving mechanism in the three-dimensional direction is not needed.

Therefore, an increase in the size of an apparatus is prevented and it is possible to construct a small system at a low cost. In addition, it is possible to accurately perform measurement even when there is a non-negligible loss in the system.

Figure 12:
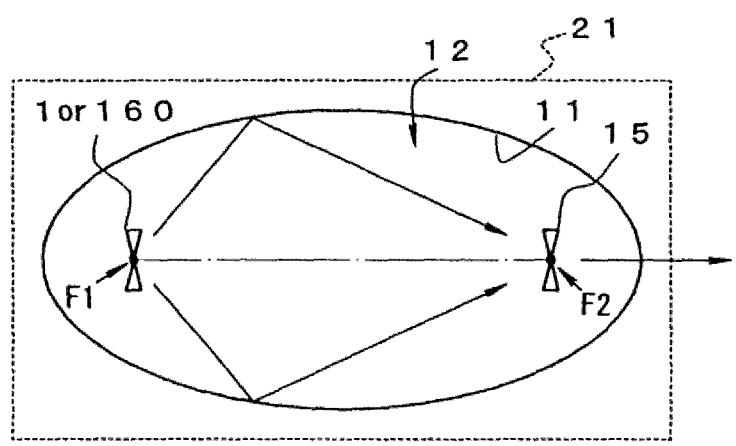
FIG. 12 is a diagram illustrating an example of a structure in which transmitting and receiving antennas are arranged so as to face each other.

In the above description, the antennas of the transmitter and the receiver are dipole-based antennas and are collinearly arranged such that the length direction thereof is aligned with the length direction of the axis of the ellipse. In addition, theoretically, it is premised that the antennas are not directly coupled to each other. However, the antennas may be arranged so as to be directly coupled to each other. For example, as shown in FIG. 12, elements of the dipole-based transmitting and receiving antennas may be arranged so as to face each other in parallel. In this case, it is possible to calculate the output reflection coefficient of the coupler 21 from the result obtained by the phase rotation of the phase rotating unit 130 and accurately calculate the total radiated power of the object to be measured from the measurement result.

(Description of Radiation Power Measuring Apparatus)

Figure 13:
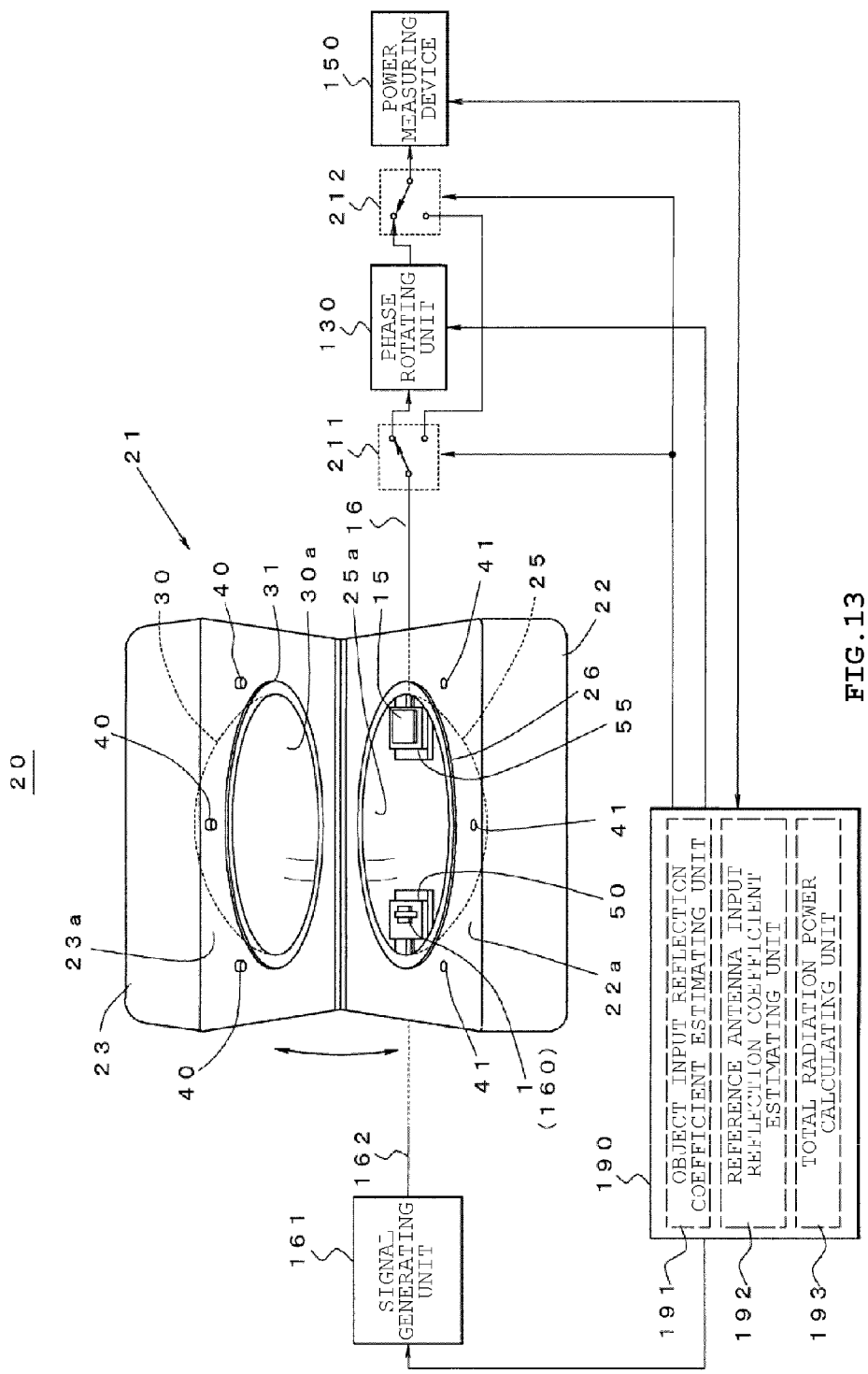
FIG. 13 is a diagram illustrating the overall structure of a radiation power measuring apparatus according to an embodiment.

FIG. 13 is a diagram illustrating the overall structure of a radiation power measuring apparatus 20 based on the measuring method.

The radiation power measuring apparatus 20 includes the coupler 21, the phase rotating unit 130, the power measuring device 150, the reference antenna 160 that is used instead of the object to be measured, the signal generator 161, a coaxial cable 162 that connects the reference antenna 160 and the signal generator 161, and the measurement control unit 190. In addition, the radiation power measuring apparatus 20 includes switches 211 and 212 that switch a state in which the coupler 21 is directly coupled to the power measuring device 150 and a state in which the phase rotating unit 130 is inserted. This switching operation may be performed by manually changing the connection of the cable.

The coupler 21 includes the wall surface 11 that surrounds the spheroidal closed space 12, a means that supports the object 1 to be measured and the reference antenna 160 such that the center of radiation thereof is disposed substantially at the position of one focus F1 in the closed space 12, and a means that supports the receiving antenna 15 such that the center thereof is disposed at the position of the other focus F2. In addition, a structure capable of opening and closing the closed space 12 such that the object 1 to be measured, the reference antenna 160, and the receiving antenna 15 can be inserted is needed.

Figure 14:
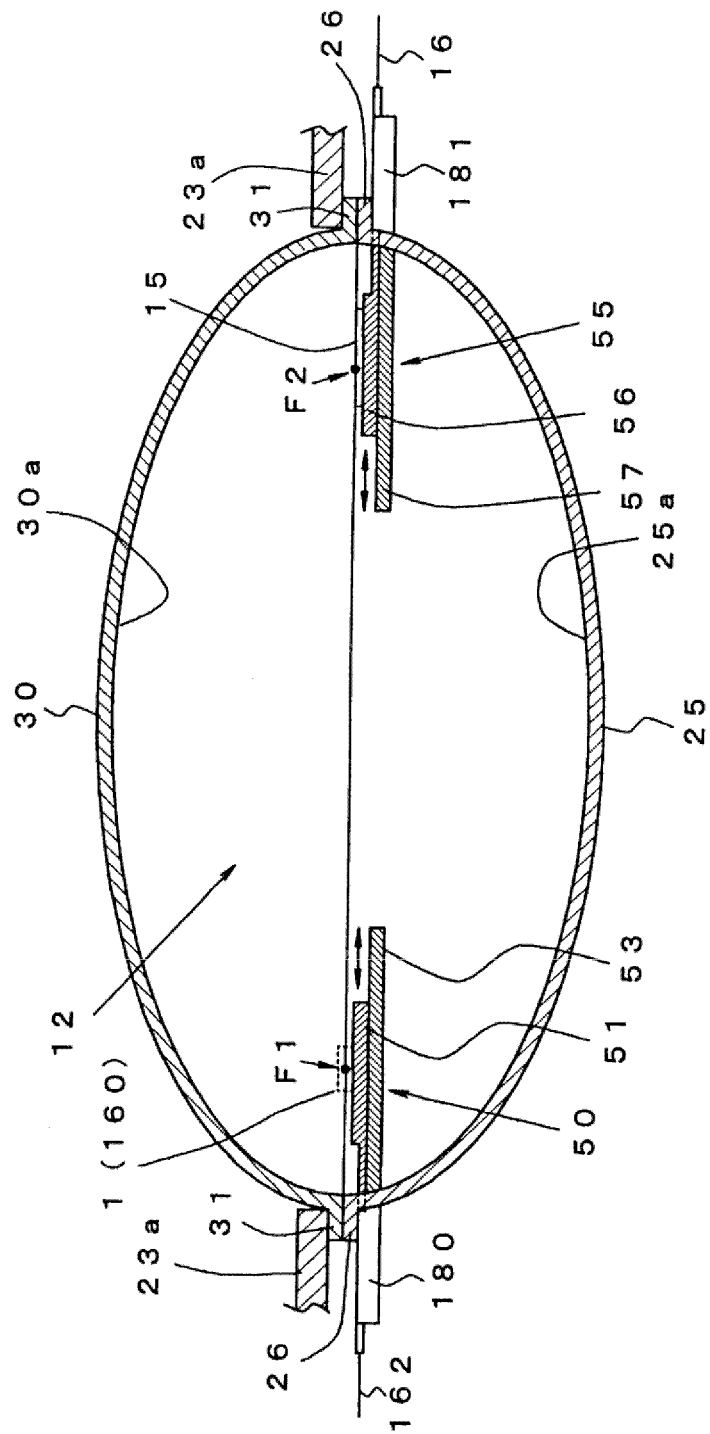
FIG. 14 is a diagram illustrating the internal structure of a main portion.
Figure 15:
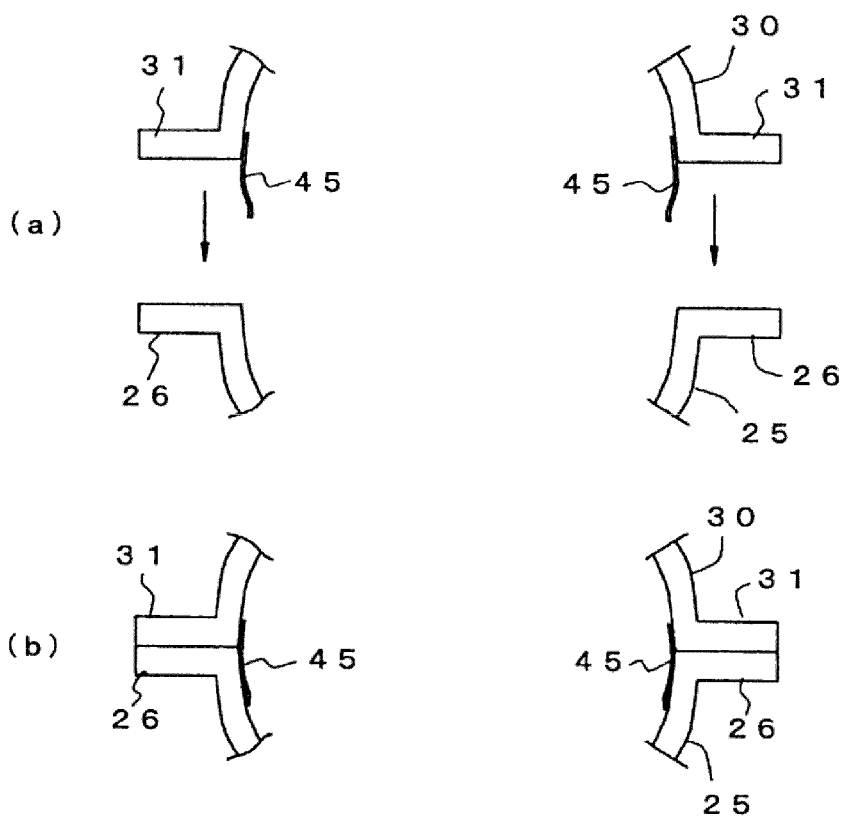
FIGS. 15A and 15B are diagrams illustrating the internal structure of a main portion.
Figure 16:
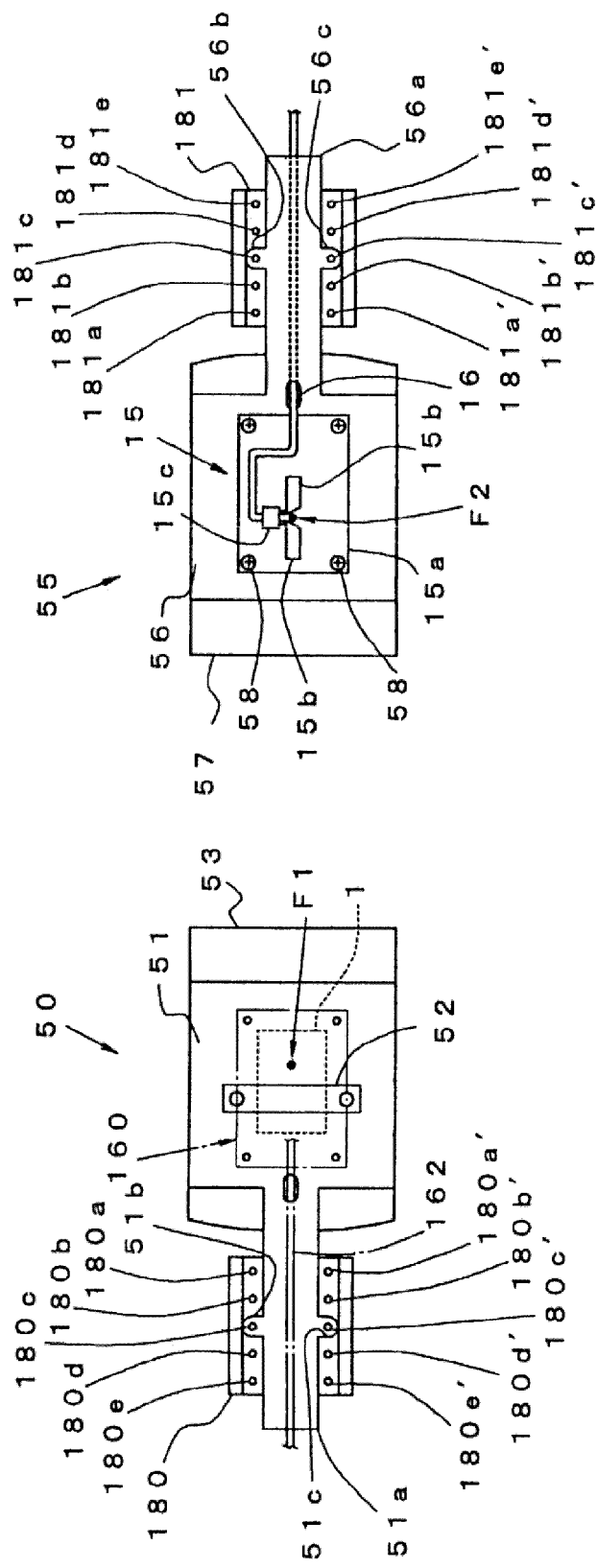
FIG. 16 is a diagram illustrating the internal structure of a main portion.

FIGS. 14 to 16 are diagrams illustrating an example of the coupler 21. The coupler 21 is an openable type including a lower case 22 and an upper case 23. An elliptical hole (not shown) is formed in an upper plate 22a of the lower case 22 and a first inner wall forming member 25 including an inner wall 25a having a shape corresponding to the shape of the outer circumference of the lower half of the spheroidal closed space 12 is attached to the hole.

For example, the first inner wall forming member 25 is formed by pressing a metal plate or a metal mesh plate that reflects radio waves or providing a metal film on the inner wall of a synthetic resin molding. A flange 26 that slightly extends to the outside and overlaps the edge of the hole is provided at the upper edge of the first inner wall forming member 25. In the first inner wall forming member 25, the flange 26 is fixed to the upper plate 22a of the lower case 22.

Similarly, an elliptical hole (not shown) is provided in a lower plate 23a of the upper case 23 and a second inner wall forming member 30 is attached to the hole.

The second inner wall forming member 30 is symmetrical to the first inner wall forming member 25. That is, the second inner wall forming member 30 includes an inner wall 30a having a shape corresponding to the shape of the outer circumference of the upper half of the spheroidal closed space 12. A flange 31 that slightly extends to the outside and overlaps the edge of the hole formed in the upper case 23 is provided at the upper edge of the hole of the second inner wall forming member 30. The flange 31 is fixed to the lower plate 23a.

The upper case 23 is openably connected to the lower case 22 by, for example, a hinge mechanism and a locking mechanism (not shown). When the upper case 23 is closed and locked so as to overlap the lower case 22, as shown in FIG. 14, the flange 26 of the first inner wall forming member 25 wholly comes into surface contact with the flange 31 of the second inner wall forming member 30 without a gap therebetween and the inner walls 25a and 30a are connected to each other. In this way, the spheroidal closed space 12 surrounded by the wall surface 11 is formed.

Positioning mechanisms (for example, guide pins 40 and guide holes 41 into which the guide pins 40 are inserted, as shown in FIG. 13) that allow the lower and upper inner wall forming members 25 and 30 to overlap each other without any positional deviation therebetween when the lower case 22 and the upper case 23 are closed are formed in the lower case 22 and the upper case 23.

For example, as shown in FIG. 15A, an elastic rib 45 is provided over substantially the entire inner edge of the opening of the inner wall forming member 30. When the inner wall forming member 30 is coupled to the inner wall forming member 25 as shown in FIG. 15B, the elastic rib 45 comes into contact with the entire inner edge of the opening of the inner wall forming member 25 to cover the contact portions of the flanges 26 and 31 of the inner wall forming members 25 and 30. Therefore, it is possible to reduce, for example, the leakage of radio waves when there is a gap between the contact portions.

In this embodiment, the upper plate 22a and the first inner wall forming member 25 in the lower case 22 are provided separately from the lower plate 23a and the second inner wall forming plate 30 in the upper case 23. However, the upper plate 22a and the first inner wall forming member 25 in the lower case 22 and the lower plate 23a and the second inner wall forming plate 30 in the upper case 23 may be integrally formed of the same material. The outer circumference of each of the first inner wall forming member 25 and the second inner wall forming member 30 has a semielliptical shape. However, the inner walls 25a and 30a may be formed along the spheroid and may have any outward shape.

As shown in FIG. 13, FIG. 14, and FIG. 16, a radiator supporting portion 50 that supports the object 1 to be measured and the reference antenna 160 in the closed space 12 is provided in the vicinity of the position of the focus F1 on the opening surface of the first inner wall forming member 25 and a receiving antenna supporting portion 55 that supports the receiving antenna 15 is provided in the vicinity of the position of the focus F2.

A position where the center of radiation of the object 1 to be measured and the reference antenna 160 is substantially aligned with the position of the focus F1 is referred to as the reference position and the radiator supporting portion 50 supports the object 1 to be measured and the reference antenna 160 so as to be movable a predetermined distance (for example, $\pm\lambda/4$ (where $\lambda$ is a center wavelength)) along an axis linking the focuses F1 and F2. The radiator supporting portion 50 includes a supporting plate 51 that is movable along the axis linking the focuses F1 and F2, a fixing tool 52 that fixes a radiator onto the supporting plate 51, a base 53 that prevents the supporting plate 51 from falling, and a first positioning mechanism 180. Among these components, components that are arranged in the coupler 21 are made of a synthetic resin material having high transmittance (specific permittivity is approximate to 1) with respect to the radio waves.

The fixing tool 52 is, for example, an extensible band that has no effect on the transmission of radio waves and fixes the object 1 to be measured or the reference antenna 160 at a predetermined position on the supporting plate 51. A shaft portion 51a that passes through the inner wall forming member 25 and slides is provided so as to protrude from the outer end of the supporting plate 51. The shaft portion 51a is fitted to the first positioning mechanism 180 that is fixed outside the inner wall forming member 25. Flanges 51b and 51c, each having a screw fastening and fixing hole formed therein, are provided on both sides of the shaft portion 51a so as to protrude therefrom.

The first positioning mechanism 180 has a concave shape in a cross-sectional view and includes a groove portion formed at the center such that the shaft portion 51a of the supporting plate 51 can be slidably held. In addition, five sets of screw holes 180a to 180e and 180a' to 180e' for fastening the flanges 51b and 51c are provided on both sides of the groove portion at an interval of, for example, one-eighth of the center wavelength λ.

As shown in FIG. 16, when the flanges 51b and 51c are fastened to the center screw holes 180c and 180c', it is possible to fix the object 1 to be measured (or the reference antenna 160) at a reference focal position.

When the flanges 51b and 51c are fastened to the inside screw holes 180b and 180b', it is possible to fix the object 1 to be measured (or the reference antenna 160) at a position that is λ/8 inside the focal position. When the flanges 51b and 51c are fastened to the screw holes 180a and 180a', it is possible to fix the object 1 to be measured at a position that is λ/4 inside the focal position. When the flanges 51b and 51c are fastened to the outside screw holes 180d and 180d', it is possible to fix the object 1 to be measured at a position that is λ/8 outside the focal position. When the flanges 51b and 51c are fastened to the screw holes 180e and 180e', it is possible to fix the object 1 to be measured at a position that is λ/4 outside the focal position.

When the reference antenna 160 is supported, for example, a hole is formed so as to pass through the shaft portion 51a of the supporting plate 51 such that the coaxial cable 162 for supplying signals can extend to the outside.

Similarly to the radiator supporting portion 50, the receiving antenna supporting portion 55 includes a supporting plate 56 that is made of a synthetic resin material having high transmittance with respect to radio waves, a base 57 that prevents the supporting plate 56 from falling, a fixing tool 58 that fixes the receiving antenna 15 onto the supporting plate 56, and a second positioning mechanism 181.

In the receiving antenna 15, in general, an etching process is performed on a substrate 15a to print an antenna element 15b. The fixing tool 58 for fixing the receiving antenna 15 is, for example, a screw or a clamp made of a synthetic resin material that does not change the characteristics of the receiving antenna 15. The fixing tool fixes the receiving antenna 15 such that the center of radiation of an antenna element of the receiving antenna 15 is disposed on an elliptical axis linking the focuses F1 and F2 on the supporting plate 56.

A shaft portion 56a that passes through the inner wall forming member 25 and slides is provided so as to protrude from the outer end of the supporting plate 56 that supports the receiving antenna 15. The shaft portion 56a is fitted to the second positioning mechanism 181 that is fixed outside the inner wall forming member 25. Flanges 56b and 56c, each having a screw fastening and fixing hole formed therein, are provided on both sides of the shaft portion 56a so as to protrude therefrom.

Similarly to the first positioning mechanism 180, the second positioning mechanism 181 has a concave shape in a cross-sectional view and includes a groove portion formed at the center such that the shaft portion 56a of the supporting plate 56 can be slidably held. In addition, five sets of screw holes 181a to 181e and 181a' to 181e' for fastening the flanges 56b and 56c are provided on both sides of the groove portion at an interval of, for example, λ/8.

As shown in FIG. 16, when the flanges 56b and 56c are fastened to the center screw holes 181c and 181c', it is possible to fix the receiving antenna 15 at a reference focal position.

When the flanges 56b and 56c are fastened to the inside screw holes 181b and 181b', it is possible to fix the receiving antenna 15 at a position that is λ/8 inside the focal position. When the flanges 56b and 56c are fastened to the screw holes 181a and 181a', it is possible to fix the receiving antenna 15 at a position that is λ/4 inside the focal position. When the flanges 56b and 56c are fastened to the outside screw holes 181d and 181d', it is possible to fix the receiving antenna 15 at a position that is λ/8 outside the focal position. When the flanges 56b and 56c are fastened to the screw holes 181e and 181e', it is possible to fix the receiving antenna 15 at a position that is λ/4 outside the focal position.

In addition, a hole is formed so as to pass through the shaft portion 56a of the supporting plate 56 such that the coaxial cable 16 of the receiving antenna 15 can extend to the outside.

As shown in FIG. 16, when the receiving antenna 15 is a dipole-based antenna or a balanced antenna, such as a loop antenna, it is connected to the unbalanced coaxial cable 16 through a balun 15c that is inserted into a feeding point. In addition, for example, a sleeve antenna may be used as the dipole antenna.

The signal received by the receiving antenna 15 is output to the outside of the coupler 21 through the coaxial cable 16 and is then input to the phase rotating unit 130.

When the position of the supporting plate 56 supporting the receiving antenna 15 is changed, the coaxial cable 16 is also moved. A flexible cable may be used as at least a portion of the coaxial cable 16 that is disposed outside the coupler 21. In this case, it is possible to connect the coaxial cable 16 to the phase rotating unit 130 without hindering the movement of the supporting plate 56. This is similarly applied to the coaxial cable 162 connected to the reference antenna 160.

The phase rotating unit 130 has the above-mentioned structure and includes the variable phase shifter 131, the two-branch circuit 132, and the reflective element 133. The variable phase shifter 131 may include the trombone-type variable-length transmission path.

The output of the phase rotating unit 130 is input to the power measuring device 150. For example, a wideband wattmeter, a receiver having frequency selectivity, or a spectrum analyzer may be used as the power measuring device 150.

The measurement control unit 190 sets the frequencies of the signal generator 161 and the power measuring device 150, controls the variable phase shifter 131, and performs the calculating process according to the above-mentioned measuring method, thereby calculating the output reflection coefficient of the coupler 21. Then, the measurement control unit 190 estimates the output reflection coefficient to be equivalent to the input reflection coefficient of the receiving unit and calculate the TRP (total radiated power) of the object 1 to be measured on the basis of the estimated input reflection coefficient.

Specifically, as shown in FIG. 13, the measurement control unit 190 includes an object input reflection coefficient estimating unit 191, a reference antenna input reflection coefficient estimating unit 192, and a total radiated power calculating unit 193.

The object input reflection coefficient estimating unit 191 calculates the ratio of the maximum value to the minimum value of the measured value of the power measuring device 150 which is changed by the phase rotating unit 130, calculates, from the ratio, the output reflection coefficient of the coupler 21 when the object 1 to be measured is used, and estimates the input reflection coefficient Γ(EUT) of the antenna of the object 1 to be measured which is approximate to the output reflection coefficient.

The reference antenna input reflection coefficient estimating unit 192 calculates the output reflection coefficient of the coupler 21 when the reference antenna 160 is used instead of the object 1 to be measured on the basis of the ratio of the maximum value to the minimum value of the reception power obtained by phase rotation and estimates the input reflection coefficient of the reference antenna 160 that is approximate to the output reflection coefficient.

The total radiated power calculating unit 193 calculates the total radiated power TRP of the object 1 to be measured on the basis of the input reflection coefficients Γ(EUT) and Γ(REF) which are respectively estimated for the object 1 to be measured and the reference antenna 160 and the maximum reception power when the output of the receiving antenna 15 is directly measured by the power measuring device 150.

Figure 17:
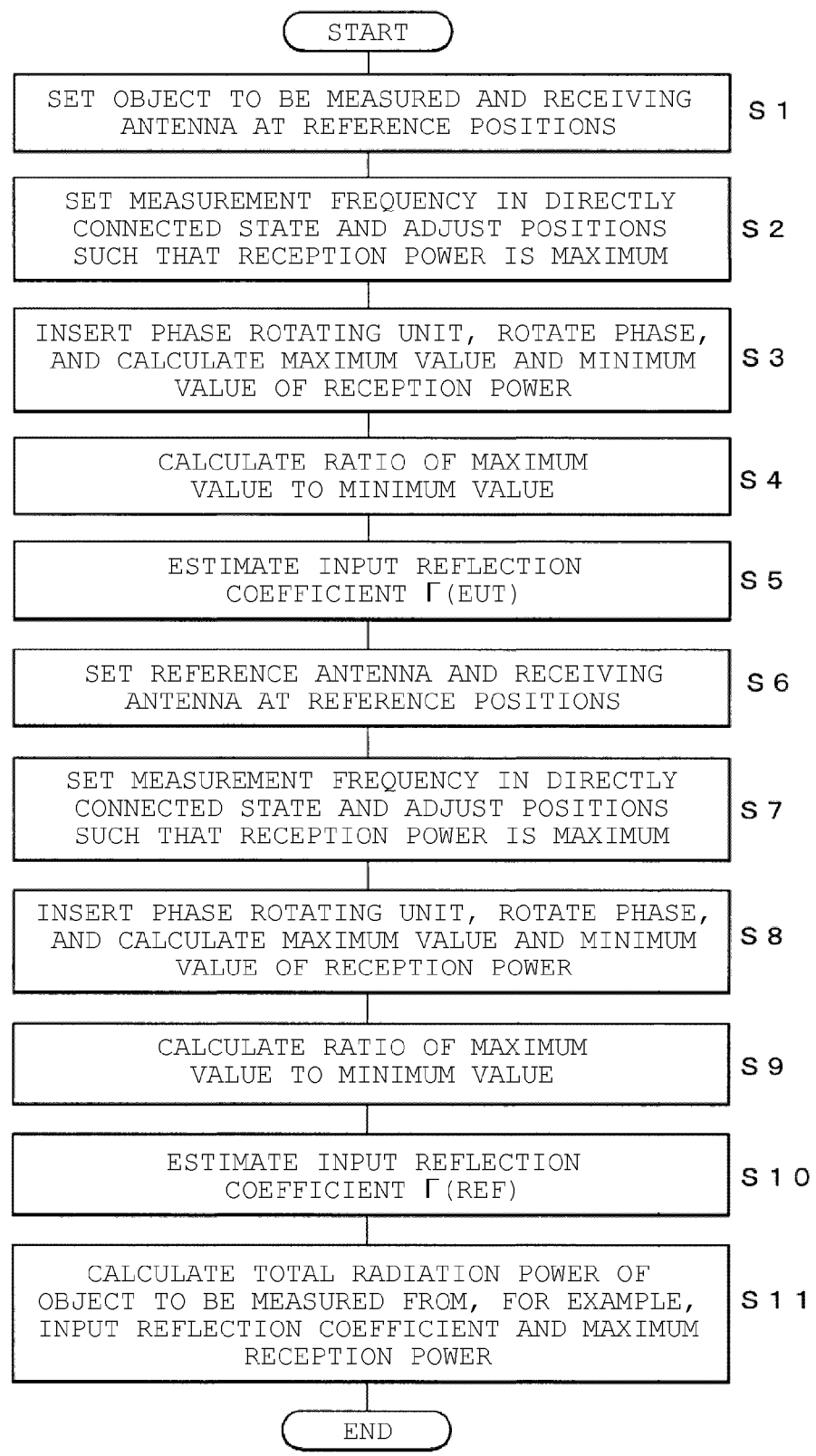
FIG. 17 is a flowchart illustrating the operation of the embodiment.

FIG. 17 is a flowchart illustrating an example of the processing principle of the measurement control unit 19. Hereinafter, the operation of the apparatus will be described on the basis of the flowchart.

First, as a preparation for measurement, the coupler 21 is opened and the object 1 to be measured and the receiving antenna 15 are supported at, for example, the reference focal position. Then, the coupler 21 is closed (S1).

Then, the coupler 21 is directly connected to the power measuring device 150, and the frequency of the power measuring device 150 is set to a measurement frequency. Then, the position of the antenna is set to the optimal position (the position of the antenna is roughly adjusted at an interval of λ/8 or is finely adjusted, if necessary) such that the measured value of the power measuring device 150 is the maximum and the measured maximum reception power Pr(EUT) is stored.

Then, the phase rotating unit 130 is inserted. The variable phase shifter 131 is controlled to continuously change the phase, thereby periodically changing the reception power detected by the power measuring device 150. Then, the maximum value and the minimum value of the reception power are calculated (S3).

Then, the ratio of the maximum value to the minimum value is calculated (S4). Then, the output reflection coefficient of the coupler 21 when the object 1 to be measured is in the transmitting unit is calculated by the above-mentioned calculating method on the basis of the ratio, and the input reflection coefficient Γ(EUT) of the antenna of the object 1 to be measured is estimated (S5).

Then, the same measuring process as described above is performed on the correction system (this measurement is performed in advance and the measurement result may be used).

That is, the coupler 21 is opened, the reference antenna 160 is set instead of the object 1 to be measured, and the coupler 21 is closed (S6).

Then, the signal with power Psg output from the signal generator 161 is supplied to the reference antenna 160 through the cable 162. The coupler 21 is directly connected to the power measuring device 150 in the same way as described above, and the frequency of the power measuring device 150 is set to a specific frequency. Then, the antenna is finely adjusted at the optimal position such that the measured value of the power measuring device 150 is the maximum and the measured maximum reception power Pr(REF) is stored.

Then, the phase rotating unit 130 is inserted and the variable phase shifter 131 is controlled to continuously change the phase, thereby periodically changing the reception power detected by the power measuring device 150. Then, the maximum value and the minimum value of the reception power are detected (S8).

Then, the ratio of the maximum value to the minimum value is calculated (S9). Then, the output reflection coefficient of the coupler 21 when the reference antenna 160 is in the transmitting unit is calculated on the basis of the ratio by the same method as described above and the input reflection coefficient Γ(REF) of the reference antenna 160 is estimated (S10).

Then, the total radiated power TRP of the object 1 to be measured is calculated by Expression 11 from the input reflection coefficient Γ(EUT) of the object to be measured, the input reflection coefficient Γ(REF) of the reference antenna, the measured maximum reception power Pr(EUT) and Pr(REF), the known output Psg of the signal generator, and the radiation efficiency ηr' of the reference antenna (S11).

In this embodiment, the frequency is fixed. However, the measurement and calculation may be performed for each frequency. In this case, it is possible to obtain the total radiated power of the object 1 to be measured for each frequency.

The measuring and estimating process may be performed on the correction system before the measuring process is performed on the measurement system, the measurement result may be stored, and the total radiated power may be calculated by the operation of the stored data and the data obtained by the measurement system.

What is claimed is:

1. A radiation power measuring method of measuring the total radiated power of an object to be measured by using a structure in which radio waves are emitted from the object which is disposed in the vicinity of one focus in a closed space that forms a spheroid obtained by rotating an ellipse about an axis passing through two focuses and is surrounded by a metal wall surface and are reflected from the wall surface to be concentrated on a receiving antenna which is disposed in the vicinity of the other focus and a power measuring device measures the power of an output signal from the receiving antenna, comprising:

a step of arranging the object in the vicinity of the one focus and arranging the receiving antenna in the vicinity of the other focus;

a step of arranging a variable phase shifter that changes the phase of the output signal from the receiving antenna and a two-branch circuit that branches the output signal from the variable phase shifter into two signals, one of which is connected to a reflective element and the other of which is connected to the power measuring device, and calculating a maximum value and a minimum value of power measured by the power measuring device according to changes of the phases by the variable phase shifter;

a step of calculating an output reflection coefficient of the inside of the spheroid from the maximum value and the minimum value of the power measured by the power measuring device and using the output reflection coefficient as an input reflection coefficient of the object; and a step of calculating the total radiated power of the object, on the basis of the input reflection coefficient of the object and reception power when the power measuring device directly measures the output signal from the receiving antenna.

2. The radiation power measuring method according to claim 1, further comprising:

a step of calculating the ratio of the maximum value to the minimum value of the power measured by the power measuring device, wherein the step of calculating the output reflection coefficient of the inside of the spheroid and using the output reflection coefficient as the input reflection coefficient of the object calculates the output reflection coefficient of the inside of the spheroid from the ratio of the maximum value to the minimum value of the power.

3. The radiation power measuring method according to claim 1, further comprising:

a step of arranging a reference antenna in the vicinity of the one focus, instead of the object;

a step of arranging the variable phase shifter that changes the phase of the output signal from the reference antenna and the two-branch circuit that branches the output signal from the variable phase shifter into two signals, one of which is connected to the reflective element, between the reference antenna and the power measuring device and calculating the maximum value and the minimum value of the power measured by the power measuring device when the variable phase shifter changes the phase; and a step of calculating the output reflection coefficient of the inside of the spheroid from the maximum value and the minimum value of the power measured by the power measuring device and using the output reflection coefficient as an input reflection coefficient of the reference antenna, wherein the step of calculating the total radiated power of the object calculates the total radiated power of the object, on the basis of the input reflection coefficient of the object, the input reflection coefficient of the reference antenna, and the reception power when the power measuring device directly measures the output signal from the receiving antenna.

4. The radiation power measuring method according to claim 3, further comprising:

a step of calculating the ratio of the maximum value to the minimum value of the power measured by the power measuring device; and a step of calculating the ratio of the maximum value to the minimum value of the power measured by the power measuring device when the reference antenna is arranged in the vicinity of the one focus, instead of the object, wherein the step of calculating the output reflection coefficient of the inside of the spheroid and using the output reflection coefficient as the input reflection coefficient of the object calculates the output reflection coefficient of the inside of the spheroid from the ratio of the maximum value to the minimum value of the power measured by the power measuring device, and the step of calculating the output reflection coefficient of the inside of the spheroid and using the output reflection coefficient as the input reflection coefficient of the reference antenna calculates the output reflection coefficient of the inside of the spheroid from the ratio of the maximum value to the minimum value of the power of the output signal from the reference antenna.

5. The radiation power measuring method according to claim 3, wherein the step of calculating the total radiated power of the object calculates the total radiated power of the object using the following expression:

$$Po\eta r = \frac{Psg\eta r'(1-|\Gamma(REF)|^2)Pr(EUT)}{(1-|\Gamma(EUT)|^2)Pr(REF)}$$

(where $Po\eta r$ is the total radiated power of the object, $Psg$ is power supplied to the reference antenna, $\eta r'$ is the radiation efficiency of the reference antenna, $\Gamma(EUT)$ is the input reflection coefficient of the object, $\Gamma(REF)$ is the input reflection coefficient of the reference antenna, $Pr(EUT)$ is reception power when the power measuring device directly measures the output signal from the receiving antenna using the object, and $Pr(REF)$ is reception power when the power measuring device directly measures the output signal from the receiving antenna using the reference antenna).

6. The radiation power measuring method according to claim 4, wherein the step of calculating the total radiated power of the object calculates the total radiated power of the object using the following expression:

$$Po\eta r = \frac{Psg\eta r'(1-|\Gamma(REF)|^2)Pr(EUT)}{(1-|\Gamma(EUT)|^2)Pr(REF)}$$

(where $Po\eta r$ is the total radiated power of the object, $Psg$ is power supplied to the reference antenna, $\eta r'$ is the radiation efficiency of the reference antenna, $\Gamma(EUT)$ is the input reflection coefficient of the object, $\Gamma(REF)$ is the input reflection coefficient of the reference antenna, $Pr(EUT)$ is reception power when the power measuring device directly measures the output signal from the receiving antenna using the object, and $Pr(REF)$ is reception power when the power measuring device directly measures the output signal from the receiving antenna using the reference antenna).

7. A radiation power measuring apparatus comprising:

a coupler that has a closed space which forms a spheroid obtained by rotating an ellipse about an axis passing through two focuses and is surrounded by a metal wall surface, includes supporting units which support an object to be measured in the vicinity of one focus and support a receiving antenna in the vicinity of the other focus, concentrates radio waves emitted from the object on the receiving antenna, and outputs a signal received by the receiving antenna from the closed space to the outside;

a power measuring device that measures the power of the output signal from the receiving antenna;

a phase rotating unit that includes a variable phase shifter which changes the phase of an input signal, a two-branch circuit which branches an input signal into two signals, and a reflective element which reflects one of the two branched outputs from the two-branch circuit with a predetermined reflectance, is inserted between the receiving antenna and the power measuring device, and changes the phase of the output signal from the receiving antenna by the change of the phase by the variable phase shifter, thereby changing a measured value of the power measuring device;

an object input reflection coefficient estimating unit that calculates an output reflection coefficient of the coupler for the object, from a maximum value and a minimum value of the measured value of the power measuring device which is changed by the phase rotating unit and uses the output reflection coefficient as an input reflection coefficient of the object; and a total radiated power calculating unit that calculates the total radiated power of the object, on the basis of the input reflection coefficient of the object and reception power when the power measuring device directly measures the output signal from the receiving antenna.

8. The radiation power measuring apparatus according to claim 7, wherein the object input reflection coefficient estimating unit calculates the ratio of the maximum value to the minimum value of the measured value of the power measuring device which is changed by the phase rotating unit, calculates the output reflection coefficient of the coupler for the object from the ratio, and uses the output reflection coefficient as the input reflection coefficient of the object.

9. The radiation power measuring apparatus according to claim 7, further comprising:

a reference antenna input reflection coefficient estimating unit that calculates the output reflection coefficient of the coupler from the maximum value and the minimum value of the measured value of the power measuring device which is changed by the phase rotating unit when a reference antenna which is arranged in the vicinity of the one focus instead of the object is used; and a total radiated power calculating unit that calculates the total radiated power of the object, on the basis of the input reflection coefficient of the object, the input reflection coefficient of the reference antenna, and the reception power when the power measuring device directly measures the output signal from the receiving antenna.

10. The radiation power measuring apparatus according to claim 9, wherein the object input reflection coefficient estimating unit calculates the ratio of the maximum value to the minimum value of the measured value of the power measuring device which is changed by the phase rotating unit, calculates the output reflection coefficient of the coupler for the object from the ratio, and uses the output reflection coefficient as the input reflection coefficient of the object, and the reference antenna input reflection coefficient estimating unit calculates the ratio of the maximum value to the minimum value of the measured value of the power measuring device which is changed by the phase rotating unit, calculates the output reflection coefficient of the coupler from the ratio, and uses the output reflection coefficient as the input reflection coefficient of the reference antenna.

11. The radiation power measuring apparatus according to claim 9, wherein the total radiated power calculating unit calculates the total radiated power of the object using the following expression:

$$Po\eta r = \frac{Psg\eta r'(1 - |\Gamma(REF)|^2)Pr(EUT)}{(1 - |\Gamma(EUT)|^2)Pr(REF)}$$

(where $Po\eta r$ is the total radiated power of the object, $Psg$ is power supplied to the reference antenna, $\eta r'$ is the radiation efficiency of the reference antenna, $\Gamma(EUT)$ is the input reflection coefficient of the object, $\Gamma(REF)$ is the input reflection coefficient of the reference antenna, $Pr(EUT)$ is reception power when the power measuring device directly measures the output signal from the receiving antenna using the object, and $Pr(REF)$ is reception power when the power measuring device directly measures the output signal from the receiving antenna using the reference antenna).

12. The radiation power measuring apparatus according to claim 9, wherein the total radiated power calculating unit calculates the total radiated power of the object using the following expression:

$$Po\eta r = \frac{Psg\eta r'(1 - |\Gamma(REF)|^2)Pr(EUT)}{(1 - |\Gamma(EUT)|^2)Pr(REF)}$$

(where $Po\eta r$ is the total radiated power of the object, $Psg$ is power supplied to the reference antenna, $\eta r'$ is the radiation efficiency of the reference antenna, $\Gamma(EUT)$ is the input reflection coefficient of the object, $\Gamma(REF)$ is the input reflection coefficient of the reference antenna, $Pr(EUT)$ is reception power when the power measuring device directly measures the output signal from the receiving antenna using the object, and $Pr(REF)$ is reception power when the power measuring device directly measures the output signal from the receiving antenna using the reference antenna).

\* \* \* \* \*